(12) United States Patent
Colvin

(10) Patent No.: US 9,034,667 B2
(45) Date of Patent: May 19, 2015

(54) APPARATUS AND METHOD FOR ENDPOINT DETECTION DURING ELECTRONIC SAMPLE PREPARATION

(71) Applicant: James Barry Colvin, Newark, CA (US)

(72) Inventor: James Barry Colvin, Newark, CA (US)

(*) Notice: Subject to any disclaimer, the term of this patent is extended or adjusted under 35 U.S.C. 154(b) by 0 days.

(21) Appl. No.: 13/861,926

(22) Filed: Apr. 12, 2013

(65) Prior Publication Data

US 2013/0273671 A1  Oct. 17, 2013

Related U.S. Application Data

(60) Provisional application No. 61/686,871, filed on Apr. 13, 2012, provisional application No. 61/686,872, filed on Apr. 13, 2012, provisional application No. 61/741,423, filed on Jul. 18, 2012.

(51) Int. Cl.
| | | |
|---|---|---|
| *H01L 21/66* | (2006.01) | |
| *G01R 1/44* | (2006.01) | |
| *B23C 3/00* | (2006.01) | |
| *B24B 37/013* | (2012.01) | |
| *G01R 31/28* | (2006.01) | |

(52) U.S. Cl.
CPC ...... *G01R 1/44* (2013.01); *H01L 22/12* (2013.01); *B23C 3/00* (2013.01); *B24B 37/013* (2013.01); *G01R 31/2898* (2013.01); *H01L 22/26* (2013.01); *H01L 2224/32145* (2013.01); *H01L 2224/32225* (2013.01); *H01L 2924/0002* (2013.01); *H01L 2224/48091* (2013.01); *H01L 2224/48227* (2013.01); *H01L 2224/73265* (2013.01); *H01L 2924/15311* (2013.01)

(58) Field of Classification Search
None
See application file for complete search history.

(56) References Cited

U.S. PATENT DOCUMENTS

| 3,640,807 A * | 2/1972 | Van Dijk .................. 438/408 |
| 4,921,564 A | 5/1990 | Moore |
| 5,393,288 A | 2/1995 | Miyasaka et al. |
| 5,444,637 A | 8/1995 | Smesny et al. |
| 5,504,434 A * | 4/1996 | Schepis et al. ............ 324/719 |
| 5,532,612 A | 7/1996 | Liang |
| 5,948,217 A * | 9/1999 | Winer et al. ............ 204/192.34 |
| 5,990,022 A | 11/1999 | Motoura et al. |
| 6,020,264 A * | 2/2000 | Lustig et al. ............... 438/692 |
| 6,303,396 B1 * | 10/2001 | Ring et al. ................. 438/14 |
| 6,356,097 B1 | 3/2002 | Loewenhardt et al. |
| 7,019,368 B1 | 3/2006 | McCollum et al. |
| 2003/0087459 A1 * | 5/2003 | Laursen et al. ............. 438/8 |
| 2004/0217092 A1 | 11/2004 | Demers et al. |
| 2005/0098195 A1 | 5/2005 | Jackson |
| 2005/0260775 A1 | 11/2005 | DiBattista et al. |
| 2006/0142971 A1 | 6/2006 | Reich et al. |

(Continued)

OTHER PUBLICATIONS

USPTO, Restriction Requirement, U.S. Appl. No. 13/861,981, Mar. 25, 2014, 8 pgs.

(Continued)

*Primary Examiner* — Charles Garber
*Assistant Examiner* — Alia Sabur
(74) *Attorney, Agent, or Firm* — The Danamraj Law Group, P.C.

(57) ABSTRACT

A method for detecting an endpoint during removal of material from an electronic device includes while removing material from an electronic device-under-test (DUT) using a tip driven by a spindle, applying an input signal to the DUT via the tip and using an output signal received from one of the DUT and a mounting plate to which the DUT is attached to determine an endpoint for removal of material.

20 Claims, 5 Drawing Sheets

(56) References Cited

U.S. PATENT DOCUMENTS

| | | | |
|---|---|---|---|
| 2008/0134689 A1 | 6/2008 | Shen et al. | |
| 2008/0290889 A1* | 11/2008 | Hillard | 324/765 |
| 2009/0014871 A1 | 1/2009 | Meyer et al. | |
| 2010/0176824 A1* | 7/2010 | Makihara et al. | 324/690 |
| 2011/0043239 A1 | 2/2011 | Tomita et al. | |
| 2011/0189925 A1* | 8/2011 | Iravani et al. | 451/5 |
| 2011/0236594 A1 | 9/2011 | Haverkamp et al. | |
| 2013/0271169 A1 | 10/2013 | Colvin | |
| 2013/0273674 A1 | 10/2013 | Colvin | |

OTHER PUBLICATIONS

Circuit Net, "What is the Proper DI Water Resistivity," www.circuitnet.com, Jun. 2009, 2 pgs, available at http://www.circuitnet.com/experts/59891.shtml.

D. Scott et al., "Global Die UltraThin Silicon for Backside Diagnostics and Circuit Edit," ISTFA 2009 Proceedings, Nov. 2009, pp. 110-118.

J. Colvin & K. Jarausch, "Atomic Force Microscopy: Modes and Analytical Techniques with Scanning Probe Microscopy," Microelectronics Failure Analysis Desk Reference, 6th ed. 2011, pp. 536-546.

J. Colvin, "BGA and advanced Package Wire to Wire Bonding for Backside Emission Microscopy," ISTFA 1999 Proceedings, Nov. 1999, pp. 365-374.

J. Colvin, "FemtoFarad/eraOhm Endpoint Detection for Microsurgery of Integrated Circuit Devices," ISTFA 2012 Proceedings, Nov. 2012, pp. 30-38.

J. Colvin, H.Patel & T. Hazeldine, "Stress Reduction during Silicon Thinning Using Thermal Relaxation and 3d Curvature Correction Techniques," ISTFA 2012 Proceedings, Nov. 2012, pp. 478-484.

Lion Precision, Capacitive Sensor Operation and Optimization, Nov. 2012, 13 pgs, available at lionprecision.com.

M. Mulholland & R. P. Wadell, "A Method of Stress Reduction during Silicon Thinning," ISTFA 2011 Proceedings, Nov. 2011, pp. 424-427.

MTI Instruments, Capacitance Measurement Products, Sep. 2011, 8 pgs, available at http://mtiinstruments.com/technology/Capacitance.aspx.

R. Desplats et al., "3D Backside Sample Preparation for Radiation Tsting," in Proc. European Space Components Conf. ESCCON 2002, 2002, pp. 1-9.

T. Lundquist et al., "Ultra-Thinning of C4 Integrated Circuits for Backside Analysis during First Silicon Debug," 2001, 5 pgs, Pergamon.

Ultra Tec Manufacturing, Inc., ASAP-1 IPS, Selected Area Decapsulation, Substrate Thinning, & Polishing, www.Ultratecusa.com, Nov. 2010, 4 pgs.

Ultra Tec Manufacturing, Inc., PLASER, Plasma Final Decapsulation Unit for Plastic IC Packages, Sep. 2010, 2 pgs, available at http://www.ultratecusa.com/plaser.

William H. Hayt, Jr., "Engineering Circuit Analysis," McGraw-Hill 3rd ed. 1971, p. 146.

William H. Hayt, Jr., "Engineering Electromagnetics," McGraw-Hill, 4th ed. 1981, p. 163.

W. Mack, 3-D SiP Devices: 3-D System in Package—How to Cope with Increasing Challenges, EDFA AO (2012) pp. 4-11, 2012.

USPTO, Office Action, U.S. Appl. No. 13/861,981, Jul. 9, 2014, 21 pgs.

USPTO, Applicant-Initiated Interview Summary, U.S. Appl. No. 13/861,981, Oct. 23, 2014, 3 pgs.

USPTO, Office Action, U.S. Appl. No. 13/861,981, Jan. 16, 2015, 12 pgs.

USPTO; Office Action; U.S. Appl. No. 13/859,902; Apr. 6, 2015; 22 pgs.

* cited by examiner

US 9,034,667 B2

APPARATUS AND METHOD FOR ENDPOINT DETECTION DURING ELECTRONIC SAMPLE PREPARATION

PRIORITY UNDER 35 U.S.C. §119(e) & 37 C.F.R. §1.78

This nonprovisional application claims priority based upon the following prior U.S. provisional patent applications entitled: "TEMPERATURE CONTROLLED STRESS REDUCTION FOR MICROMACHINING SEMICONDUCTOR DEVICES," Application No. 61/686,871, filed Apr. 13, 2012; "CAPACITIVE AND RESISTIVE ENDPOINT DETECTION FOR MICROMILLING AND POLISHING," Application No. 61/686,872, filed Apr. 13, 2012; and "CAPACITIVE AND RESISTIVE ENDPOINT DETECTION FOR MICROMILLING AND POLISHING I," Application No. 61/741,423, filed Jul. 18, 2012, all in the name(s) of James Barry Colvin and all of which are hereby incorporated by reference in their entirety for all purposes.

CROSS-REFERENCE TO RELATED APPLICATION

This application discloses subject matter related to the subject matter disclosed in the following commonly owned co-pending U.S. patent application(s): "APPARATUS AND METHOD FOR ELECTRONIC SAMPLE PREPARATION," application Ser. No. 13/859,902, filed Apr. 10, 2013 in the name of: James Barry Colvin and "APPARATUS AND METHOD FOR ENDPOINT DETECTION DURING ELECTRONIC SAMPLE PREPARATION," application Ser. No. 13/861,981, filed Apr. 12, 2013, in the name of James Barry Colvin; which are hereby incorporated by reference in their entirety.

BACKGROUND OF THE DISCLOSURE

1. Technical Field

The present disclosure generally relates to techniques for preparing electronic devices, such as integrated circuit dies, chips, packages, boards, and the like, for failure analysis. More particularly, and not by way of any limitation, the present disclosure is directed to an apparatus and method for detecting an endpoint during removal of material from the sample.

2. Description of Related Art

During failure analysis of integrated circuits (ICs), whether in chips, packages, boards, etc., it is often necessary to create access to specific portions of the IC. Methods of creating these access points include at least chemical, laser, mechanical and plasma usage, yet each method of creating access brings its own problems. Laser decapsulation is slow and places the surface at risk due to ablation damage through the glass beads. Additionally, non-uniformity of removal is problematic with both chemical and laser mechanisms. Physical removal methods, such as milling, grinding and polishing, provide greater planarity of removal, but the process, which is generally performed with a liquid or paste surrounding the moving tip, obscures visibility of the surface of the device-under-test (DUT). In the past, mechanical methods have required iterative guesswork to reach the desired target. One would estimate the depth necessary to provide access without destroying features and perform mechanical removal, e.g., with a milling machine, to the desired depth. The device would then be removed from the milling machine, cleaned and dried, and taken to another machine, e.g., a microscope or electron microscope, for examination to determine whether the desired endpoint had been reached. If further removal of material was necessary, the process would be repeated as many times as necessary until the desired endpoint was reached.

BRIEF DESCRIPTION OF THE DRAWINGS

The accompanying drawings are incorporated into and form a part of the specification to illustrate one or more exemplary embodiments of the present disclosure. At least one drawing figure comprises a black and white photomicrograph or photocopy thereof of an Infra Red (IR) interference fringe pattern taken using an IR microscope on an electronic sample prepared according to the teachings of the present patent application. Applicant submits that the black and white photomicrographs are the only practicable medium for illustrating the IR interference fringe patterns in a meaningful fashion. See 37 CFR 1.84(b)(1). Various advantages and features of the disclosure will be understood from the following Detailed Description taken in connection with the appended claims and with reference to the attached drawing figures in which:

DETAILED DESCRIPTION OF THE DRAWINGS

Figure 1:
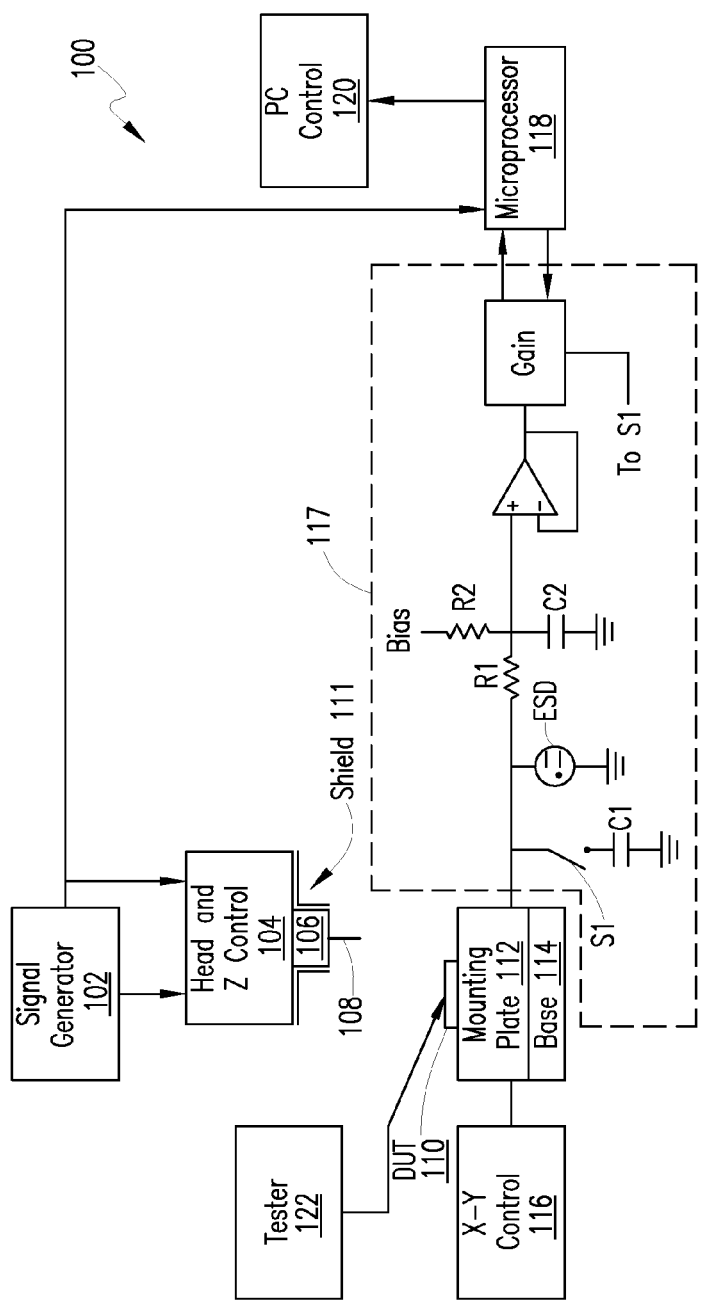
FIG. 1 depicts an apparatus for mechanical removal of material from an IC device with endpoint detection according to one embodiment of the disclosure.

The present application discloses an apparatus and method to detect an endpoint during mechanical removal of material from an IC device. The method and apparatus provide an electrical signal that is fed to the device-under-test (DUT) via the tip used to remove material from the DUT. The type of signal used is determined by the type of material being removed and/or the number of layers to be removed. The DUT is monitored, either directly or through a connection to the mounting plate, to track a response signal. Examples of several techniques and corresponding signals are provided, but the specific embodiments shown are for illustration only and do not limit the disclosed method and apparatus. In a first embodiment, an AC waveform signal is provided as the input signal, which is preferably pulsed. This signal can be used when removing packaging material or when removal moves through alternating layers of conductive and non-conductive materials. The output signal may provide any of resistance value, capacitance value or a combination of both components and is used to determine an endpoint. In a second embodiment, a DC signal is provided in which the voltage sweeps through a predetermined range, which may include positive and/or negative values. This signal is used when thinning silicon or moving through different layers of the silicon. The output signal can provide a resistive component and a breakdown voltage component and can be used to determine a desired endpoint. Additional details concerning endpoint detection during electronic sample preparation may be found in the paper titled "FemtoFarad/TeraOhm Endpoint Detection for Microsurgery of Integrated Circuit Devices", written by the inventor and presented in the Conference Proceedings from the 38$^{th}$ International Symposium for Testing and Failure Analysis (ISTFA), Nov. 11-15, 2012, pages 30-38, which is hereby incorporated by reference in its entirety.

In one aspect, the present disclosure is directed to an embodiment of a method that includes the following operations or acts: while removing material from an electronic device-under-test (DUT) using a tip driven by a spindle, providing an input signal on the tip; and using an output signal received from one of the DUT and a mounting plate to which the DUT is attached to determine an endpoint for removal of material.

In one aspect, the present disclosure is directed to an embodiment of a method that includes the following operations or acts: while removing material from an electronic device-under-test (DUT) using a tip driven by a spindle, supplying an input signal to the DUT; and using an output signal received via the tip to determine an endpoint for removal of material.

In one aspect, the present disclosure is directed to an embodiment of an apparatus that comprises: means for characterizing at least one electronic device as to an inherent relationship between a given characteristic of the at least one electronic device and a thickness of material remaining over a given target, the at least one electronic device having been produced using a given process; means for determining an endpoint value based on the characterized relationship and a desired amount of material to be left over the given target; means for removing material from an electronic device-under-test (DUT) using a tip driven by a spindle while applying an input signal to a first electrode, the DUT having been produced using the given process; and means for using an output signal received from a second electrode to terminate the removal of material when the output signal reaches the endpoint value, wherein the first electrode is one of the DUT and the tip and the second electrode is the opposite one of the DUT and the tip. The two electrodes are considered opposites in that they form a pair of electrodes having complementary functions.

Currently the disclosed method and apparatus provide control to less than one µm using resistive, capacitive and/or breakdown detection through the IC device, allowing controlled and repeatable removal of material without the need to "stop and look". The methodology allows approach to embedded defects both horizontally and vertically, while greatly reducing the chance of overshoot by monitoring during the removal, local electrical values as the material is thinned. Additional flexibility can be achieved by using masking methods to expose multiple areas of the DUT, as well as by using the ability to perform local mapping of embedded features on the same machine.

Embodiments of the disclosure will now be described with reference to various examples of how the embodiments can be made and used. Like reference numerals are used throughout the description and several views of the drawings to indicate like or corresponding parts, wherein the various elements are not necessarily drawn to scale.

FIG. 1 depicts a functional block diagram of an apparatus 100 that can be used to mechanically remove material from a DUT 110 using the disclosed endpoint detection methods. Apparatus 100 can be, for example, an UltraTec ASAP-1 IPS digital polisher. As seen in this figure, a signal generator 102 is connected to head 104 of apparatus 100 and used to provide an input signal through tip 108 to DUT 110 during the mechanical removal of material from DUT 110. The device-under-test can be any device subject to endpoint mapping, e.g., an IC chip, IC package, board or any other product on which the disclosed measurements can be performed. Mounting plate 112 is connected to signal detection circuitry 117. Signal detection circuitry 117, as shown in this embodiment, is configured to sense capacitance down to 10 femto farads (fF) and resistance out to 1 tera ohm. A high impedance instrumentation amplifier is used at the front end to monitor voltage swing on mounting plate 112 and a very low capacitance gas electrostatic discharge (ESD) protection circuit is included. In at least one embodiment, the follower circuit is designed for 50 giga-ohm-1 tera-ohm input impedance. The gain on mounting plate 112 can be controlled both by the gain stage and by selection of additional capacitance tied to the mounting plate, i.e., capacitor C1. Large capacitance can then be discriminated from resistance values with this control. Resistor R1 and capacitor C2 comprise a low pass filter to control input noise to the follower. Resistor R2 is a high impedance bias circuit used to set the mounting plate floating voltage. R2 is typically greater than 100 giga ohms. Capacitance of the plate was 100 pF based on current experimental results, but can be adjusted to suit the need. The charge on mounting plate 112 can drift with capacitance so it is necessary to add approximately 1 tera-ohm of resistance, i.e., the bias at R2, tied to the midpoint voltage to control drift. The upper and lower main plates were tied to ground to minimize interference and parasitic capacitive influence based on head height. Spindle 106 was configured to drive a coupled 3.3 volt pulse signal to tip 108.

Mounting plate 112 is isolated from base 114 with standoffs and air space to keep capacitance below 20 pico farads. Additional parallel capacitance can be controlled by microprocessor 118 through switch S1 for further gain reduction. The positioning of DUT 110 is controlled in the XY plane by control 116 and in the Z direction by head 104 in order to know precisely where the signal is injected into the part. Microprocessor 118 provides coordinated control of the position of tip 108, the speed of spindle 106 and the loading force on tip 108. A guard shield 111 under head 104 helps focus the electrostatic field and reduce AC interference. In one embodiment, guard shield 111 was formed of copper tape, although other forms of shielding can also be used. Base 114 is grounded below the plate with an air gap or low k dielectric spacer tied to an optional thermal controller (not specifically shown).

Both microprocessor 118 and computer 120 provide a user interface to collect and control data and hardware. Endpoint thresholds can be set and used as part of the process to automatically mill or polish and stop a predetermined distance from the target. Microprocessor 118 provides timing critical measurements, controls all processes involved in positioning, removal of material and endpoint detection. As will be discussed in greater detail throughout the application, detection of the desired endpoint will depend on the materials being removed, the specific processes used to manufacture the device-under-test, the type of signal applied and the desired target. The microprocessor can be any microprocessor or FPGA engine suitable to the required task. A tester or parametric analyzer 122 is optional and is used when the signal from the device is obtained from the tester rather than using microprocessor 118. Tester 122 interfaces directly with the device providing pass/fail or parametric data to microprocessor 118 at speeds sufficient to allow accurate measurement of the interaction between the tip and the DUT. Signals injected via the tip can be monitored for local influence on the device and mapped. At any time during or after the removal of material from the DUT, the ability to provide an input signal via tip 108 and receive an output signal from DUT 110, or alternatively to provide an input signal via DUT 110 or mounting plate 112 while receiving an output signal via tip 108, allows additional mapping and/or testing of the DUT.

Software on apparatus 100 was provided to do the following:
  Differentially detect the capacitively coupled charge transferred to mounting plate 112 via the DUT 110 from tip 108 into the low femto-farad range and high gigaohms range;
  Sample and remove local AC interference;
  Accumulate and average the data stream, displaying a running result during operation, and control DC drift in purely capacitive environments; and
  Provide force feedback control and closed loop operation of the capacitive endpoint to auto stop at a predetermined value.

Figure 2:
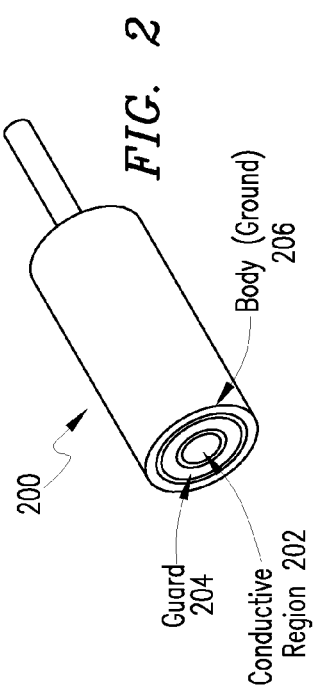
FIG. 2 depicts a tip that can be used for either scanning of an IC device or endpoint detection during mechanical removal of material from an IC device according to one embodiment of the disclosure.
Figure 4B:
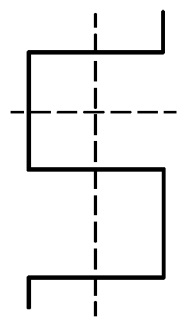
FIGS. 4A and 4B illustrate output signals that exemplify a capacitive response and a resistive response respectively according to one embodiment of the disclosure.
Figure 4A:
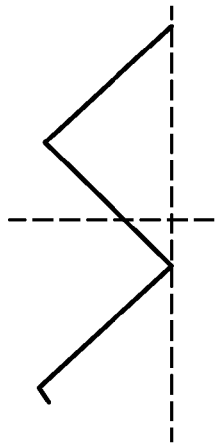

FIG. 2 is an enlarged view of a tip 200 that can be used with apparatus 100, e.g., as tip 108. While tip 200 can be used during removal of material, it is also possible to use tip 108 for mapping or scanning of a previously thinned DUT. This versatility allows a single machine to be used to both prepare and test the DUT, rather than requiring the sample to be removed from a machine used for prepping the DUT, cleaned and taken to a separate machine for testing. Tip 200 has a cylindrical shape and in the disclosed embodiment contains three concentric regions. A central conductive region 202 serves to carry either the input signal, when the input signal is provided to the tip, or the output signal, when the input signal is provided to the DUT/mounting plate. Central region 202 is surrounded by an optional guard 204 and by a body 206. Guard region 204 is used to shield the central conductive region from outside noise. Tip 200, and variations on this tip, can be used with various types of signals, including resistive and electrostatic detection. Spatial resolution is limited by tip geometry for resistive, capacitive and magnetic sensing while resolution improvements with guard ring technology are anticipated to improve resolution to <40 nanometers for electrostatic detection. Central conductive region 202 can be formed of any material that satisfies both the conductivity requirements and meets any additional requirements placed on the tip by the process of material removal. Applicant has found that carbon-based tips were best for scanning of the DUT, while lead-based tips were best during material removal in a slurry, e.g., a diamond paste.

A number of embodiments of the disclosed method will now be discussed with reference to FIGS. 3-11. The signal provided to the device can vary, depending on the type of material being removed and the target to be reached. Embodiments include a resistive sense mode, capacitive sense mode and a threshold breakdown sense mode. These modes will be described with reference to specific situations in which these modes can be used. One skilled in the art will understand, however, that the determination of a type of input signal to use and the characteristic that is tracked in the output signal can be dependent upon the nature of the material being removed, the underlying materials and the specific problem being addressed. For all of these reasons, variations and combinations of the disclosed modes can be utilized in numerous ways without going outside the scope of the disclosed embodiments.

Figure 6:
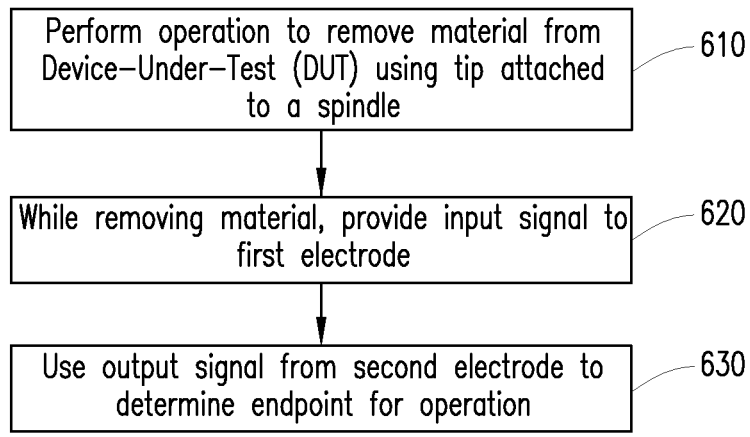
FIG. 6 depicts a method of determining an endpoint during material removal according to an embodiment of the disclosure.
Figure 7:
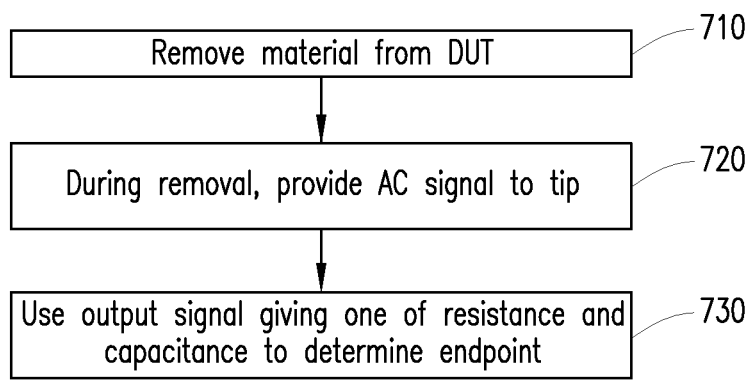
FIG. 7 depicts a method of determining an endpoint during material removal according to an embodiment of the disclosure.

The broadest embodiment of the disclosed method is shown in FIG. 6 and contains the following steps. In the broadest embodiment, the method can be thought of as applying a signal to a first electrode and reading that signal as it is received at a second electrode, with the two electrodes being the tip and the DUT. When the DUT is electrically tied to the mounting plate, the mounting plate can also be considered as part of the same electrode. Because of noise created by the motor driving the spindle in a typical milling machine, the signal is most easily driven through the tip and read from the DUT, which can be shielded from the noise of the motor. However, one could use, for example, an air-driven motor to drive the spindle, which creates less noise, then provide the signal to the DUT and read the output on the tip. The use of a tip as shown in FIG. 2 will also serve to minimize noise in the signal. In step 610, an operation is performed to remove material from the DUT using a tip attached to a spindle, e.g., spindle 106. The tip can be a milling tip, a polishing tip or other tip able to facilitate removal of material from, the DUT. While the operation is performed to remove material, an input signal is provided to a first electrode (step 620). An output signal received from the second electrode is used to determine an endpoint for the removal operation (step 630). One skilled in the art will recognize that although the examples in the present application are generally presented as applying the signal to the tip and reading the output signal from the DUT/mounting plate, the disclosed method and device are equally applicable when the signal is applied to the DUT/mounting plate and read from the tip.

How the desired endpoint is determined will depend of the DUT and the processes used during manufacture of the DUT and the signal applied. In an application in which the target is to remove a given number of layers of a device that are alternately conductive and non-conductive, the desired endpoint may be determined by noting the movement of the output signal between a low-resistive value and a high resistive/capacitive value a number of times that reflects the desired number of layers. In other applications, it may be desirable to characterize a sacrificial part that was created using the same manufacturing process as the DUT, removing material from the sacrificial part and mapping the relationship between a specific characteristic, such as resistance, capacitance, threshold breakdown voltage, etc. and the thickness of material remaining over the desired target. This mapping can then be used to set an endpoint for material removal. It may be desirable, for example, to leave ten or so micrometers of material overlying a target in order to avoid polishing away a desired feature. The relationship between the desired depth of remaining material and the characteristic being mapped is then identified and used to terminate the removal of material. As noted later in this application, the input signal and therefore the output signal can take a variety of forms. In the embodiments discussed below, two specific signals are discussed: a pulsed AC signal and a sweeping DC signal. However, one skilled in the art will understand that other types of input signals can also be used and the corresponding output signal monitored for endpoint detection. In the first embodiment, the method follows FIG. 7. In this figure, material is removed from the DUT (step 710). During removal of the material, an AC waveform is applied to DUT 110 through tip 108 (step 720). The output signal provides one of resistance and capacitance measurements and is used to determine the endpoint (step 730). The sampling is done differentially at pulse low and pulse high intervals allowing subtle leakage to be identified during the removal of insulators as the conductor is being exposed. The high impedance means reverse bias leakage in a semiconductor will still be readily detected through complex diode paths.

In a first example, the disclosed method is used to create access to a Plastic Quad Flat Pack (PQFP). The disclosed method is used to expose the die after first definitively locating the surrounding leads. Final removal of material from the die is not performed using the milling process; instead the disclosed process is used to stop milling at a target 30 µm above the die and 5-10 µm above the leads. The disclosed method uses the capacitive sense mode to approach first above the leads. Then the capacitive sense mode is used in a smaller access to endpoint above the die. As is shown in this example, a sudden impulse change can be received during the capacitive sense mode and indicates contact, either directly or through DI water in small cracks, to the underlying layer. Exposed regions can be masked and in at least some instances, the presence of contact via DI water in the cracks can provide an endpoint that is within an acceptable range. It should be noted, however, that some packaging materials can give a purely resistive response to the pulsed signal, while still other materials can provide a response that moves from one type of response to another.

DUT 110 is attached to mounting plate 112, e.g., using hot wax, with one or more of the leads of DUT 110 in contact with mounting plate 112 so that mounting plate 112 will follow the signal at DUT 110 in response to the input signal. An appropriate tip 108 is selected, as is the desired area to be opened; alternative, the area may be loaded from a previous recipe. Tilt is corrected and a preliminary pocket 100 µm deep is cut. The surface is wiped clean and de-ionized (DI) water is added only in the pocket; the DI water is held in the pocket by surface tension. The input signal used in this example is a pulsed waveform of alternating current (AC) forming a square wave, such as the square-wave signal shown in FIG. 4A. Although the pulsed waveform is not necessary for resistive endpoint detection, use of the pulsed signal provides the ability to discriminate between a purely resistive output signal, such as the saw-tooth wave seen in FIG. 4B, and a capacitive response, which assumes the nature of the square wave of FIG. 4A. As milling of the DUT is performed, the output signal is monitored to detect a desired endpoint value in capacitance. This desired endpoint can be determined in one of several ways. Knowledge of the material being removed allows the capacitance to be calculated at a desired thickness of remaining material; this calculated value can be selected as the desired endpoint. Alternatively, a sacrificial part can be used to create a graph of the relationship between the remaining thickness of material over a target and the received capacitance. In the example, the plastic packaging material is known to be an epoxy mixed with glass beads. The milling process can cause tiny disruptions within the epoxy/glass material; when the DI water contacts a conductive part, such as a bond wire, through a local crack or pocket in the packaging proximal to the bond wire, a resistive response signal abruptly appears with a reduced resistance value. The process should be stopped immediately when this happens. A design criterion of the circuitry is to make the output current ($I_o$) leakage measure a strong detected endpoint signal. Because the detected endpoint signal in this instance originates from DI water contacting the bond wires through imperfections in the material, a thin layer of the epoxy/glass material remains over the leads even after the resistive response over the leads is detected (e.g., 5-10 µm). Depending on the desired next step, the remaining material over the leads can be left in place or removed using other processes. In this example, the target was to locate, but not uncover the leads, leaving a thin layer of packaging material in place, which has been accomplished.

If an endpoint is obtained due to an unwanted area being exposed, it is possible to mask this signal and continue with an altered target area. The pocket can be rinsed out, dried and coated with a thin layer of mineral oil to isolate the endpoint signal. The area is retargeted and DI water added. The disturbed areas from milling will wet with all other areas remaining isolated. Endpoint will occur on approach of next feature related to the milling area. However, when an endpoint is detected, close inspection may not always reveal the local region responsible. In those situations in which the location needs to be identified, the following technique can be used to map or identify the defect location while the DUT remains on the same machine. The mounted DUT is first washed and dried, then a bead of DI water is suspended from a small tip and the tip is moved slowly over the cavity, hovering above the surface so that only a small area of contact is created between tip 108 and DUT 110 through the bead of DI water. An input signal is provided to the tip, with a positive reading indicating the proximity of the leakage. The water trail behind the moving tip will evaporate, allowing the area to be triangulated. This method has been successfully used to identify the highest exposed bond wire.

Figure 3:
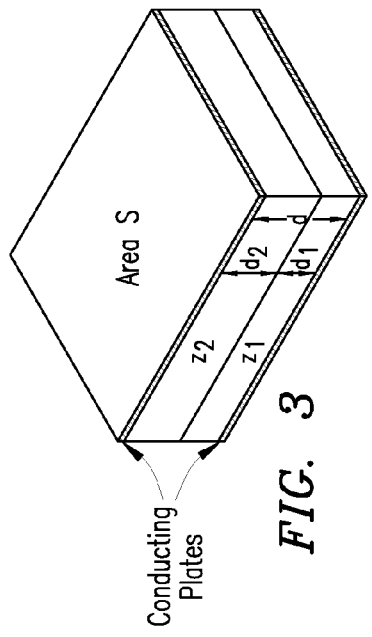
FIG. 3 illustrates the features used in determining capacitance between two plates.

In the example discussed above, once the leads have been definitively located, the area inside the leads is defined for further material removal and the process is continued. It should be obvious that the cavity over the die inside the bond loops can be cut first or, as in this example, the endpoint over the lead can be masked to allow the process to continue in the smaller area inside the leads. In order to mask the endpoint over the leads, the pocket is filled with hot wax; after cooling, the wax is milled through for the interior pocket. Fluid tension will again keep the DI water in the pocket. Mineral oil is not effective in this instance to mask the endpoint over the leads, since the wall cannot be rebuilt with oil to the surface of the part. In order to achieve accuracy in the capacitive measurements, the water or other conductive material must be contained in a constant area, defined by the surface currently being milled. In the capacitance mode, the range of detection is defined by the ratio of the capacitance through the DUT 110 and the capacitance of mounting plate 112, i.e., the capacitors are in series, as shown in FIG. 3. The formula for capacitance is:

$$C = \epsilon * E_o * A/D, \text{ where}$$

$E_o = 8.854 \times 10-12$;

$\epsilon$=dielectric constant of the material;

A=overlapping surface area of the plates;

D=distance between the plates; and
C=capacitance.
For 2 differing dielectric materials, the equation becomes:

$$C=1/[(d_1/\epsilon_1 S)+(d_2/\epsilon_2 S)]$$

As in the resistive example, a pulsed waveform is applied to tip 108 at the desired frequency. The range of resistance to be measured is defined primarily by the RC time constant of the mounting plate, with R being the resistance through the DUT to the mounting plate and C the capacitance of the mounting plate. Slower frequency is used to measure larger resistance. The charge is transferred to and from mounting plate 112 by the recurring pulse and the resultant voltage on the plate is measured by circuit 117. The amount of voltage change on the plate is controlled by capacitor C1 and switch S1 and hence the gain. Capacitance increases inversely proportional to the distance between the two plates. With the continuing use of DI water in the pocket during the removal process, the upper, water-filled cavity being milled defines the upper plate of the capacitor while the die, which is electrically connected to mounting plate 112, forms the lower plate of the capacitor. As the pocket descends, distance decreases to the die (or other desired conductive object) and the capacitance increases.

Figure 5B:
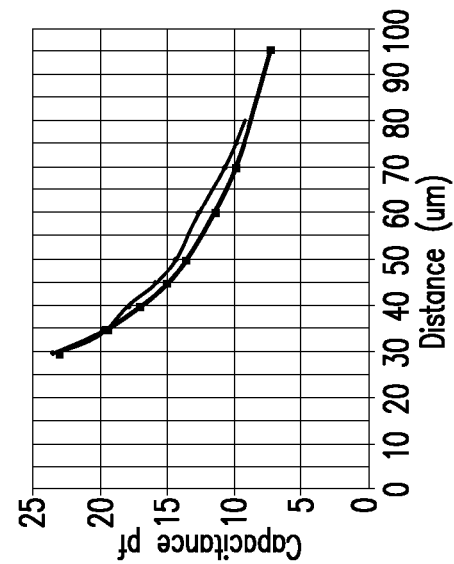
FIG. 5B is an enlargement of a portion of FIG. 5A that illustrates the relationship in the last 100 micrometers.
Figure 5A:
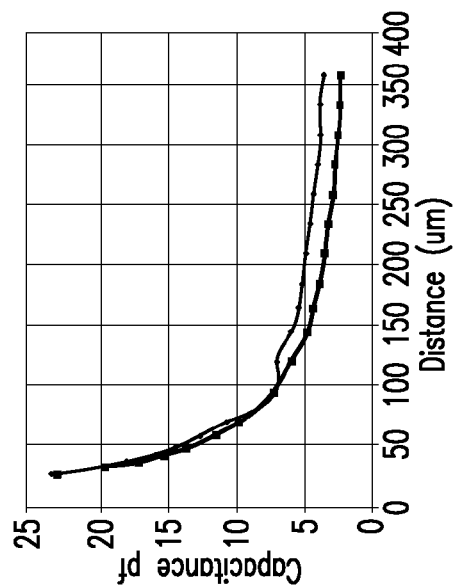
FIG. 5A illustrates the theoretical and actual values for thickness of material versus capacitance obtained in one embodiment of the disclosed method.

Since distance is inversely proportional to capacitance for a parallel plate capacitor, as shown in the equation above, the endpoint reading accuracy drastically improves as the target endpoint is approached. A resistive component of the output signal will show as an RC time constant based on time to charge the 100 pico farad plate through the resistor, similar to FIG. 4B, while a capacitive response yields a square wave based on the ratio of charge transferred to the lower sensor plate. The pulse rate is differential at ¼ line frequency=7.5 Hz. The software samples and discriminates capacitance (square wave) from resistance (saw-tooth wave). Since DI water has resistivities of 20 mega ohm-cm or less, contact between the DI water and the IC chip will appear as a sudden impulse change in the output signal, indicating endpoint. Care should be taken when approaching the die when only a single device is available; where available, a sacrificial part can be used to characterize the capacitance/distance curve. With the DI water pocket serving as the upper plate of the capacitor, the area of the floor cut by the milling tip, not the tip diameter, determines the capacitance. FIG. 5A shows the increase in capacitance as the die is approached. Two lines are shown in this figure; the darker shaded line is a theoretical capacitance and the lighter line is the actual capacitance measured during the milling process. The right-hand side of FIG. 5A shows the capacitance at the beginning of the data collection to be under 5 pico farads. As the distance to the die decreases during milling, the capacitance increases to over 20 pico farads, with the slope increasing. As the slope of capacitance increases, the increment between data points is reduced. In this example, the data points are initially recorded at 25 μm increments, then 10 μm then 1 μm increments were used, with recorded measurements taken every 5 μm. The jump seen in the actual data from 120 μm to 360 μm is due to liquid sitting over the cavity edge creating error with a falsely increased plate area for the capacitor. At this point, the DUT was cleaned and dried, then DI water returned to the cavity and milling continued with more accurate results. FIG. 5B is an expanded graph of capacitance during milling, showing only the last 100 μm. Worst-case error is 5 μm at 60 μm remaining thickness. Amplifier drift issues were found and corrected.

The capacitances being measured in this example are in the range of 0-25 pico farads. At these low values, it becomes imperative to reduce noise in the signal, hence the ground shielding added to the milling device and around the injection tip to reduce noise and focus the electrostatic field. The sensing apparatus is partially or fully enclosed in a Faraday cage as needed to reduce external fields. Further, the sampling is typically done on harmonic intervals of periodic noise and differentially removed. An example is the 60 Hz ambient noise in a typical lab, which is synchronized with the CPU either by phase locked loop (PLL) or by setting a crystal clock to a multiple or submultiple of the periodic noise frequency. The data then is always sampled at the same point in the slope of the noise waveform canceling the error as long as the amplitude of the noise is within the valid measurement range of the amplifier.

Obviously, aggressive removal can be done until the last 100 to 200 μm from the target to save time. Applicant has found that endpoint based on prior experience can be done in 5 to 10 minutes depending on area and tip size used. Unknown DUTs, with no x-ray or practice part, can take 30 minutes or more with caution exercised. Once the capacitive endpoint is reached, the part is ready for analysis and/or final decapsulation to remove the thin remaining layer.

Several issues should be noted:
- Dry milling to a resistive endpoint requires the tip to physically contact the wire resulting in excessive damage. Additionally tribo-charging of the material during removal causes wild DC swings on the endpoint. Therefore, the use DI water or similar solution is preferable;
- False early endpoint can occur if package leads or surface capacitors couple to the cavity due to residue or splashing; disclosed masking methods can be used if needed;
- Die tilt needs to be checked on approach at around 60 μm and corrected using tip scan methods to map the local capacitance variation over the die;
- Capacitance data can be erroneous due to die coat, tilt or delamination issues. A resistive endpoint is typical for delamination or cracks to prevent die damage since the liquid will enter and wet a bond underneath; and
- Lateral parasitic capacitance was largely ignored, as was the issue of varying dielectric constants in the material. Special cases may require characterization. Generally the parasitic from the lead dress and lead frame can be ignored since the primary signal will dominate on approach to endpoint.

The endpoint method can be used to thin silicon substrates on a variety of packages. The setup differs because polarity now matters and the substrate leakages are well below the giga-ohm range and into the 100 kilo-ohm range or less for tip scan measurements. Several modifications and observations for the setup are noted:
- Capacitance plate measurement method will not work in most cases due to the conductive nature of the substrate;
- Resistive substrate methods that include covering the milling area with an ionic liquid, such as DI water, will result in low impedance readings making local thinning 2D readings problematic. Instead, the tip should be locally conductive, using either a tip core insert or else a tip containing one or more soft alloys of copper, aluminum, carbon, lead, tin, antimony, gold and indium. Additionally, covalent compounds should be used around the tip, such as mineral oil as a lubricant;
- In order to determine the current/voltage (IV) curve and breakdown threshold of the silicon, the signal should sweep through a range of values, which can include both positive and negative values. Resistance alone can be used but the threshold breakdown is independent of resistance and represents the best metric for thickness; and Conductive tip design and interface becomes important since the tip cannot rely on the fluid to provide conductivity. The conductive tip must maintain intimate contact with the silicon as it is scanned and removed.

Figure 8:
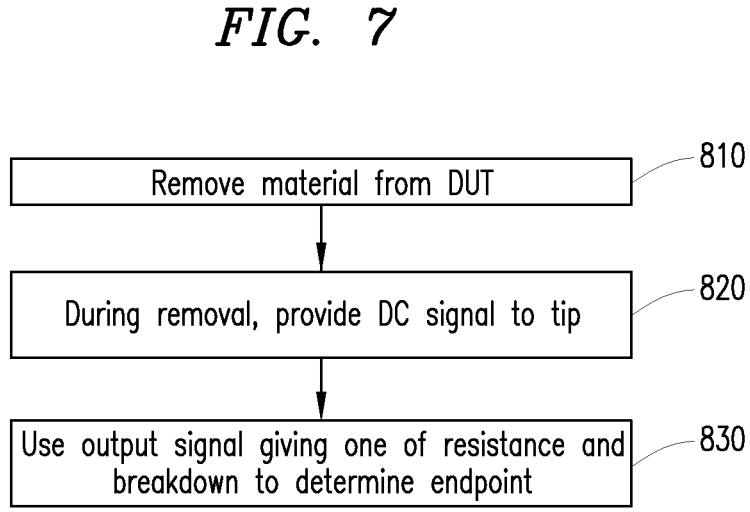
FIG. 8 depicts a method of determining an endpoint during material removal according to another embodiment of the disclosure.

The method used in thinning silicon with endpoint is shown in FIG. 8. Again, material is removed from the DUT by a mechanical means of removal (step 810). During removal, a DC signal is applied to the DUT via the tip (step 820). In at least one embodiment, the DC signal sweeps through a range of values, which may include both negative and positive values. An output signal derived from the DUT reflects one or both of resistance and breakdown threshold and is used to determine an endpoint (step 830).

Figure 11:
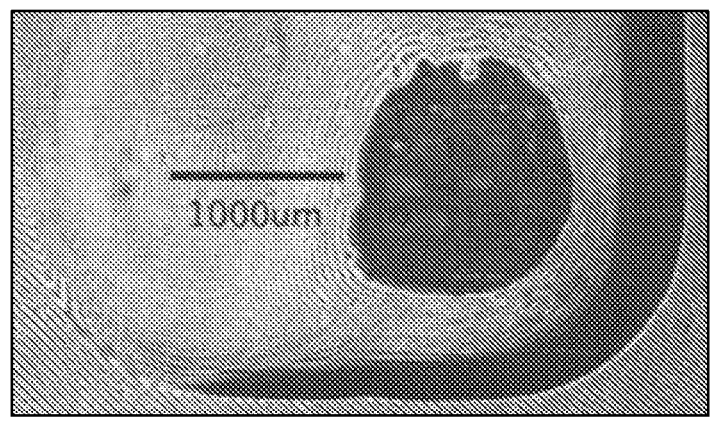
FIG. 11 is a photomicrograph depicting fringe patterns obtained from an electronic sample used to characterize the breakdown voltage at various silicon thicknesses for a given process according to an embodiment of the present patent application.

For endpoint detection during removal of silicon, the part can be mounted while on the board or individually. Since the capacitance endpoint is not of concern and the impedances are in the kilo-ohm range a large board poses no problem. The die surface is tilt corrected and can be heated to relax the stress as described in a co-pending application titled "APPARATUS AND METHOD FOR ELECTRONIC SAMPLE PREPARATION", filed Apr. 10, 2013 and receiving application Ser. No. 13/859,902, which is hereby incorporated by reference. In the process described herein, a sacrificial part is thinned at a tilt in order to determine the correspondence between the breakdown threshold and the thickness of the silicon. Once the silicon process has been characterized using the sacrificial part, this characterization can be used to stop the process at a given thickness of silicon on the DUT. The DUT used in this example was a ball-grid array (BGA) with the silicon exposed. The BGA was mounted and electrically connected to mounting plate 112. Nylon screws were used to provide a constant gentle down pressure to hold the balls in contact with the plate. In the sacrificial part, die curvature was deliberately left in order to provide characterization. The surface of the sacrificial part was polished to 50 micrometers globally, then pocket polished further with a 2 mm diameter Xylem (non-conductive) tip with the traditional iterative method. Once an open area through the silicon was observed the process was halted. The result is shown in FIG. 11, which is a photograph of the pocket. A scan line at 0,−690 to −1000,−690 pm was chosen, based on a 0,0 origin in the center of the pocket. The equation that was used to calculate the thickness variation based on interference patterns is shown in the following equation:

$$\Delta t = (\lambda * OPD)/(2*n)$$

where
n=index of refraction=3.434 for silicon;
$\Delta t$=change in silicon depth;
$\lambda$=wavelength of light; and
OPD=number of observed fringes.

Putting in the constants (n and $\lambda$) the equation can be simplified for silicon at 1064 nm in the equation below:

$$\Delta t = OPD * 0.155$$

Figure 9A:
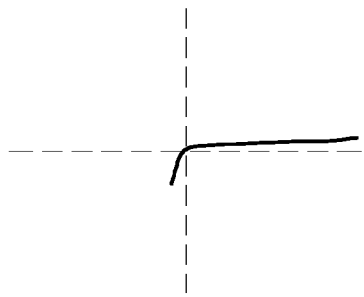
FIGS. 9A, 9B and 9C illustrate output signals that exemplify a purely resistive response moving toward a purely threshold breakdown response as silicon is thinned according to one embodiment of the disclosure.
Figure 9B:
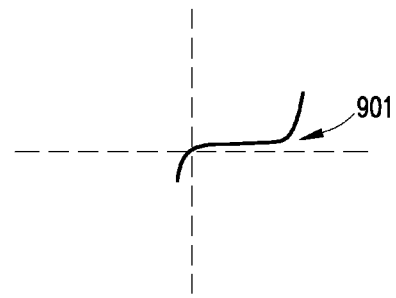
Figure 9C:
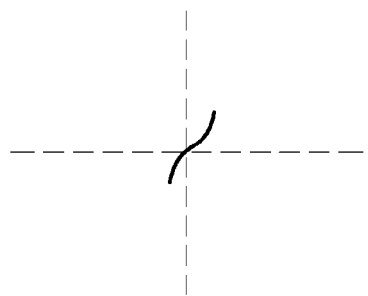
Figure 10:
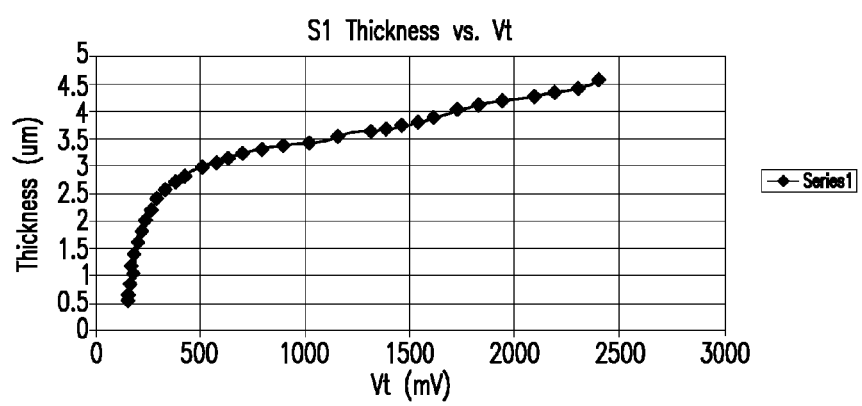
FIG. 10 illustrates a graph of threshold breakdown voltage in silicon versus the thickness of the silicon.

The fringes are counted to precisely represent the thickness at each coordinate allowing characterization of the relationship between threshold and thickness. A 150 μm soft carbon scan tip was used to profile the electrical characteristics of the substrate with a loading force of 5 grams for the general area in X and Y to identify the relationship between thickness and resistance. Alternatively, a soft metal tip can also be used. FIGS. 9A-C show the shift in the output signal as the tip moves along the scan line. FIG. 9A represents the signal received at location x=−1000 μm, while FIG. 9C represents the signal at location x=−500 μm; FIG. 9B demonstrates an intermediate breakdown voltage. In FIG. 9A, the positive voltages on the right side of the X axis show a resistive component, but no breakdown "elbow" is seen. As the active p-n junctions are approached, the elbow that represents the breakdown voltage moves to the left, reflecting the lower voltages at which breakdown occurs. FIG. 10 shows the resulting graph that reflects the correspondence between thickness of the silicon versus the diode breakdown threshold for the particular process that has been characterized.

Figure 12:
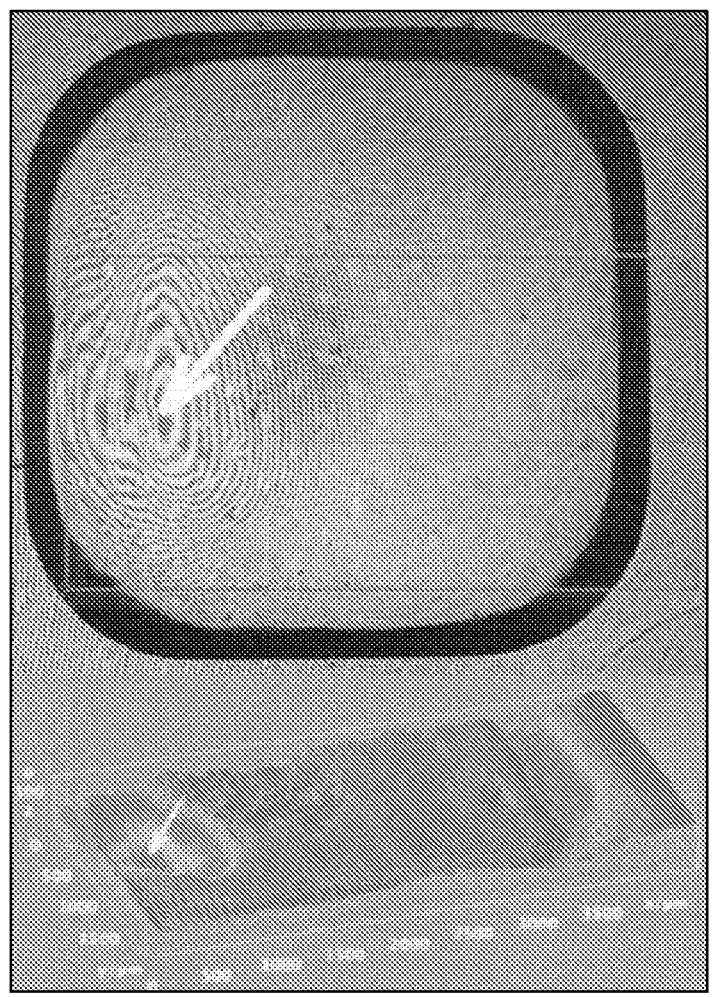
FIG. 12 is a photomicrograph depicting interference fringe patterns obtained from an example electronic sample to verify the accuracy of the method according to an embodiment of the present patent application.

After characterization, a pocket was thinned on the DUT, using a modified Xylem tip with a soft metal conductive core insert. Endpoint detection was used and the process stopped when any portion of the scan showed a moving breakdown below 3.3 volts. Thinning continued for a target endpoint at >2 μm while parametrically monitoring the substrate. FIG. 12 is the laser scan image (LSM) showing fringe minima on the lower left. A conductive scanning probe microscope image (C-SPM) of the same area was taken. Tip scan conductivity using a soft 150 μm carbon tip down to 2 grams constant force on the ASAP-1 IPS confirms the minima at 2.5 μm of remaining silicon, which correlated perfectly to the LSM image. Notably, the signal output received from milling on the silicon sample did not require the highly sensitive circuitry shown in FIG. 1. This is because the amount of current carried by the silicon is larger, e.g., in micro-amps instead of nano amps as in the resistive/capacitive example. This larger current can be directly measured by the curve-tracing equipment without the high degree of concern for noise of the earlier example. Of course, each individual case should be separately analyzed to determine the amount of amplification and noise reduction necessary.

Substrate thinning of epitaxial or degenerate substrates is accomplished with similar methods except the substrate leakage will change from low ohmic to a diode behavior as the active area below the doped substrate is exposed. Characterization is recommended on a sacrificial unit to identify the expected electrical characteristic versus thickness for a given process technology.

It should be clear from this work that the Ultra Tec ASAP-1 IPS system has been reconfigured as a scanning probe microscope (SPM) meeting the three basic definitions of an SPM, which are a scanning tip, 3-dimensional scan control and force feedback. Using the reconfigured apparatus as described, current can be injected or an electrostatic field formed or measured from the scanning tip. Local two dimensional and three dimensional SPM mapping using capacitance, magnetic and conductive responses have been added to the software. The ability to perform mapping in combination with milling and polishing eliminates the need to go between different tips—offering a clear step towards the universal tip that failure analysis engineers are keen to find. Moreover, the combination approach opens the door to in-situ characterization, including local injection of current into an active substrate for latch-up or similar sensitive node localization with a scanning tip. Mapping and feedback control of local conductive, electrostatic, and magnetic fields interactive with material removal becomes possible.

One skilled in the art will understand the variations in the process that can be utilized using the disclosed apparatus and method. For example, if the desired target is to remove a given number of layers that are alternately conductive and dielectric, the output signal can be monitored for values that move between low-resistive values and high-resistive values. Similarly, when moving between layers of silicon with varying characteristics, the signal can be monitored for changes in the character of the signal that provide clues as to the layer currently being removed. Although removal of materials has been described with reference to DI water used around the tip, colloidal silica or other ionic polishing compounds can be used also. The paper "FemtoFarad/TeraOhm Endpoint Detection for Microsurgery of Integrated Circuit Devices", authored by the inventor, is available online.

Controlled microsurgery has been demonstrated with capacitive and resistive feedback control. This opens the door for improved resolution with SQUID Microscopy, INSB thermography (Lock-In), Thermal Laser Stimulus and similar techniques without fully exposing the die topside or stopping at the desired critical target thickness on silicon from the backside. Multiple pockets can be created with each prior pocket masked enabling complex multiple access points to an IC or multi chip module. Dendritic leakage issues can be monitored and approached allowing the remaining 5 µm to 10 µm of plastic to be ion milled for surface science analyses. Plastic removal issues with copper wires, especially fine pitch wires damaged with acid and/or Laser techniques, can also be alternatively exposed using slower plasma methods due to much thinner plastic profiles. Capacitance and resistive mapping of local features by scanning/milling with the tip opens up a world of new possibilities. Follow-on techniques that can be performed after thinning on the same machine include the measurement of magnetic field proximity with a magnetoresistive sensor in place of the tip and the measurement of local capacitance based on sample/tip interaction and mapping using the CPU to scan and sample. The cavity must be dry for these techniques or filled with a covalent liquid for local capacitive coupling. Additional techniques include measurement of an electrical open when an associated structure is severed by the milling tip using the external parametric or tester interface. The plate can be driven with the waveform and the tip used to measure by reversing the system shown.

Based on the foregoing Detailed Description, it should be appreciated that the present disclosure advantageously provides a scheme for endpoint detection during the removal of various materials to prepare electronic samples for failure analysis. Although the disclosure has been described with reference to certain example embodiments, it is to be understood that the embodiments shown and described are to be treated as exemplary embodiments only. For example, whereas an endpoint detection based on electrical signal and response is described in detail, other types of signals may be also provided for purposes of the present patent application, including, for instance, magnetic and electrostatic signals can be provided and appropriate output signals monitored. The part can be powered on to monitor changes in activity as the thinning progresses or as specific structures are removed.

Accordingly, although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Those skilled in the art will therefore recognize that the exemplary embodiments described herein can be practiced with various modifications, substitutions, alterations and the like within the spirit and scope of the claims appended below.

What is claimed is:

1. A method for detecting an endpoint during removal of material from an electronic device, the method comprising:
   while removing material from an electronic device-under-test (DUT) using a tip driven by a spindle, providing an input signal on a conductive portion of the tip; and
   using an output signal received from one of the DUT and a mounting plate to which the DUT is attached to determine an endpoint for removal of material.

2. The method of claim 1 wherein the DUT is one of an integrated circuit (IC) chip, an IC package and an IC board.

3. The method of claim 1 wherein the input signal comprises an alternating current (AC) signal and the output signal provides at least one of a resistance value and a capacitance value.

4. The method of claim 3 further comprising applying a conductive liquid to a region surrounding the tip, wherein the region occupied by the conductive liquid defines an upper conductive plate for determination of the capacitance value.

5. The method as featured in claim 1 wherein the input signal is a direct current signal that sweeps across a given range of voltages and the output signal provides at least one of a resistance value and a breakdown voltage value of the material.

6. The method of claim 5 wherein the material being removed is silicon.

7. The method of claim 5 wherein the output signal changes between a low ohmic signal and a threshold breakdown signal as different layers of silicon are removed.

8. The method of claim 5 further comprising applying a conductive paste during the removal of the material.

9. The method of claim 1 wherein the DUT is powered on during removal of material and the output signal monitors changes in activity on the DUT.

10. The method of claim 9 wherein the removal of material includes removal of specific structures.

11. The method of claim 1 wherein the input signal is one of a magnetic signal and an electrostatic signal.

12. The method of claim 1 wherein the material varies from a conductive material to a nonconductive material and the output signal varies from a low-resistive value to a high-resistive value as material is removed.

13. A method for detecting an endpoint during removal of material from an electronic device, the method comprising:
    while removing material from an electronic device-under-test (DUT) using a tip driven by a spindle, supplying an input signal to the DUT; and
    using an output signal received via a conductive portion of the tip to determine an endpoint for removal of material.

14. The method of claim 13 wherein the input signal comprises an alternating current (AC) signal and the output signal provides at least one of a resistance value and a capacitance value.

15. The method of claim 13 wherein the input signal is a direct current signal that sweeps across a given range of voltages and the output signal provides at least one of a resistance value and a breakdown voltage value of the material.

16. The method of claim 13 wherein the input signal is one of a magnetic signal and an electrostatic signal.

17. An apparatus for detecting an endpoint during removal of material from an electronic device, comprising:
    means for setting an endpoint value based on a relationship between a given characteristic of an electronic device-under-test (DUT) and a desired amount of material to be left over a given target;
    means for removing material from the DUT using a tip driven by a spindle while applying an input signal to a first electrode; and means for using an output signal received from a second electrode to terminate the removal of material when the output signal reaches the endpoint value, wherein the first electrode is one of a conductive portion of the DUT and the tip and the second electrode is the opposite one of the DUT and the tip.

18. The apparatus of claim 17, further comprising means for recording the given characteristic while material is removed from a sacrificial part to facilitate determination of the endpoint value, the sacrificial part having been produced using a process that was used on the DUT.

19. The apparatus of claim 18, further comprising means for providing one of an AC waveform signal, a DC signal in which the voltage sweeps through a predetermined range, a magnetic signal, and an electrostatic signal.

20. The apparatus of claim 17, wherein the given characteristic comprises one of resistance, capacitance and a threshold breakdown voltage.

* * * * *